(12) United States Patent
Estacio

(10) Patent No.: US 6,867,489 B1
(45) Date of Patent: Mar. 15, 2005

(54) SEMICONDUCTOR DIE PACKAGE PROCESSABLE AT THE WAFER LEVEL

(75) Inventor: Maria Cristina B. Estacio, Cebu (PH)

(73) Assignee: Fairchild Semiconductor Corporation, Portland, ME (US)

(*) Notice: Subject to any disclaimer, the term of this patent is extended or adjusted under 35 U.S.C. 154(b) by 0 days.

(21) Appl. No.: 10/349,131

(22) Filed: Jan. 21, 2003

Related U.S. Application Data

(60) Provisional application No. 60/351,728, filed on Jan. 22, 2002.

(51) Int. Cl.$^7$ ............................................. H01L 23/48
(52) U.S. Cl. .................... 257/692; 257/698; 257/737
(58) Field of Search ................................ 257/263, 692, 257/698, 737

(56) References Cited

U.S. PATENT DOCUMENTS 5,814,884 A * 9/1998 Davis et al. ................ 257/723
6,355,542 B1 * 3/2002 Andoh ........................ 438/460
6,645,791 B2 * 11/2003 Noquil et al. ............... 438/108

* cited by examiner

*Primary Examiner*—Allan R. Wilson
(74) *Attorney, Agent, or Firm*—Brian N. Young; Townsend and Townsend and Crew, LLP

(57) ABSTRACT

A method for forming a semiconductor die package is provided. The method comprises: forming a semiconductor die including a source contact region and a gate contact region at a first side and a drain contact region at a second side; forming a first conductive path on the semiconductor die extending from the source contact region at the first side to the second side; forming a second conductive path on the semiconductor die extending from the gate contact region at the first side to the second side; and attaching the semiconductor die to a circuit substrate so that the second side is proximate to the circuit substrate and the first side is distal to circuit substrate.

25 Claims, 17 Drawing Sheets

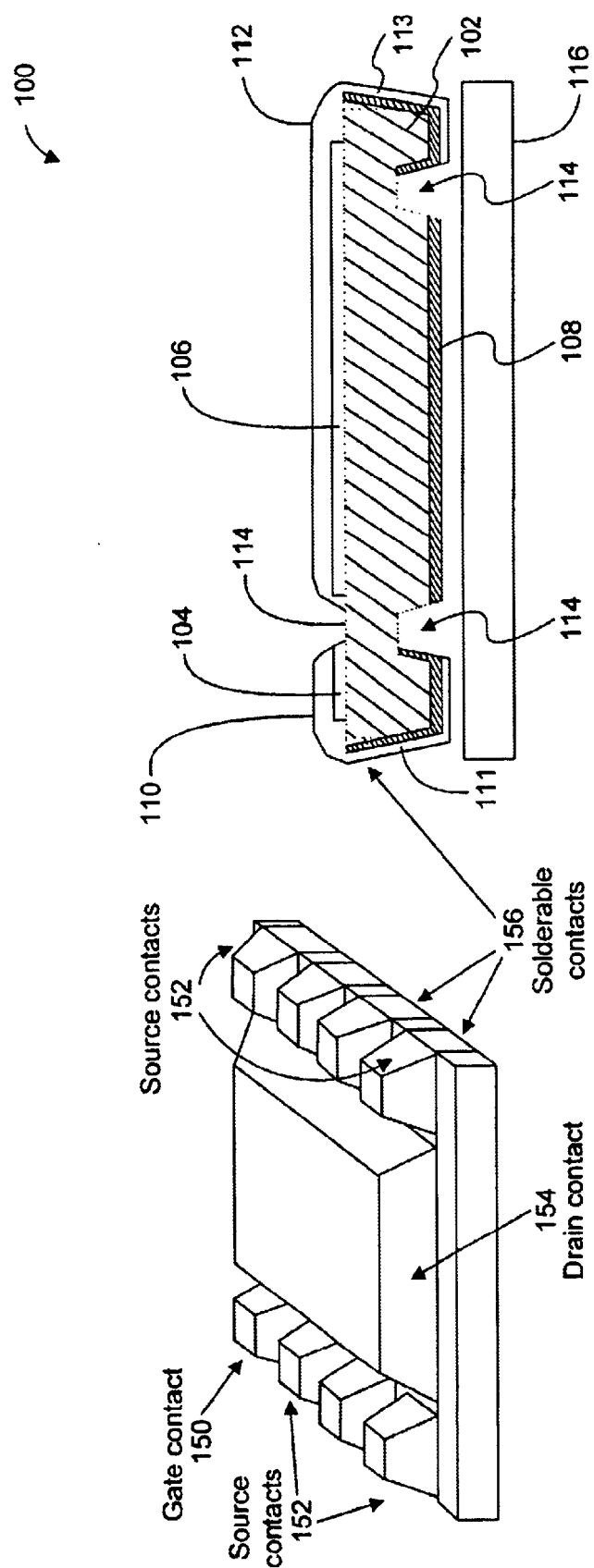

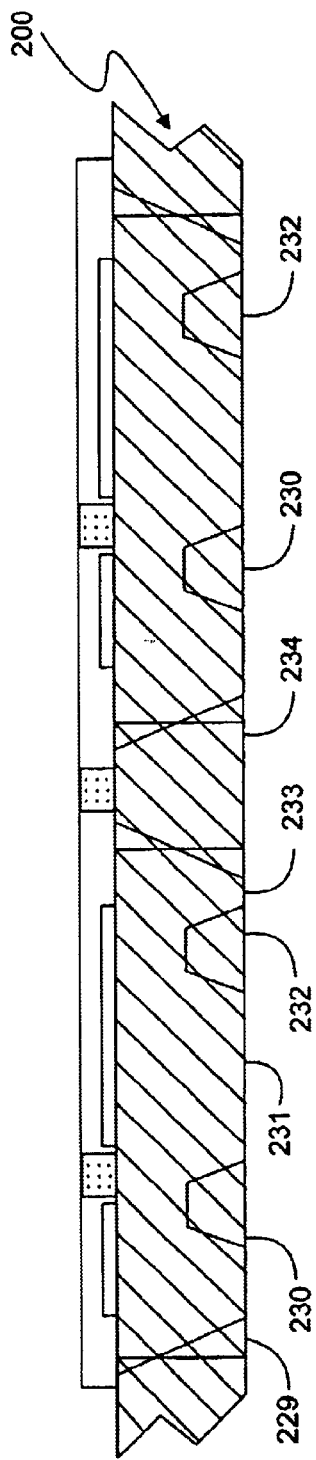
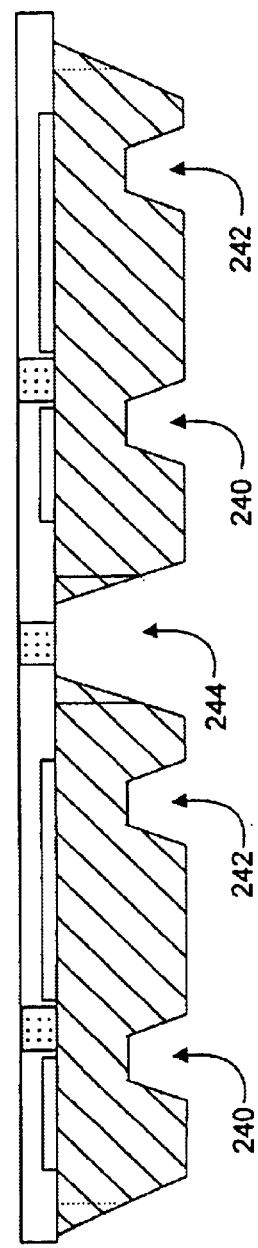
Fig. 2c
Fig. 2d

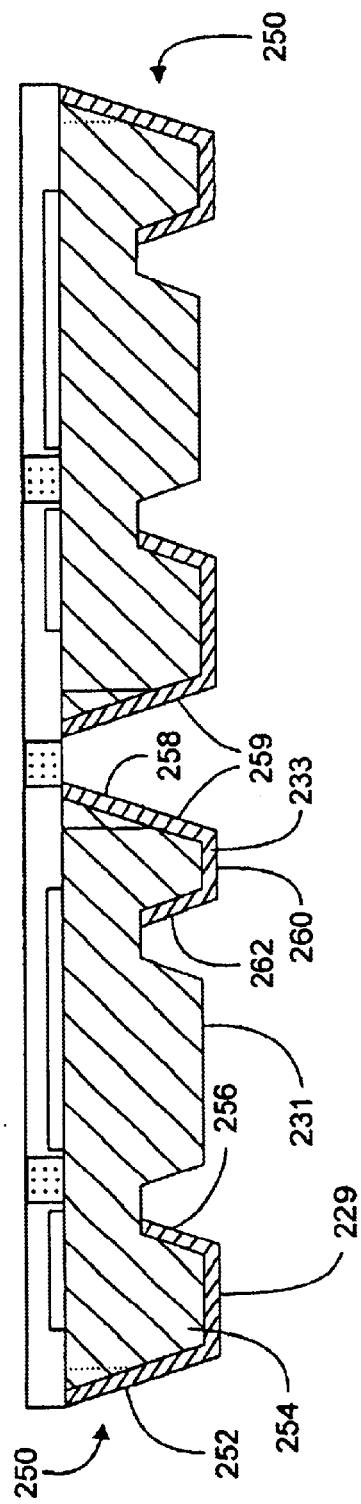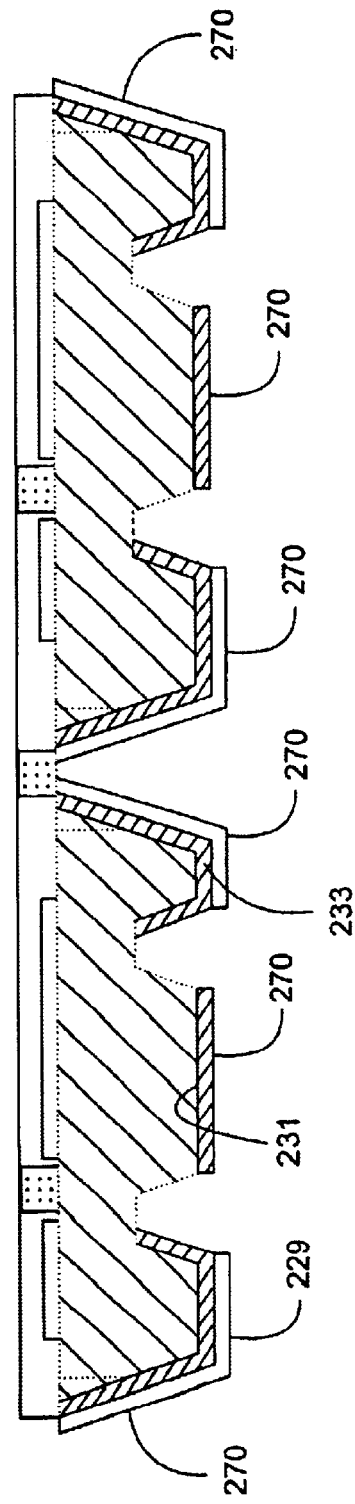

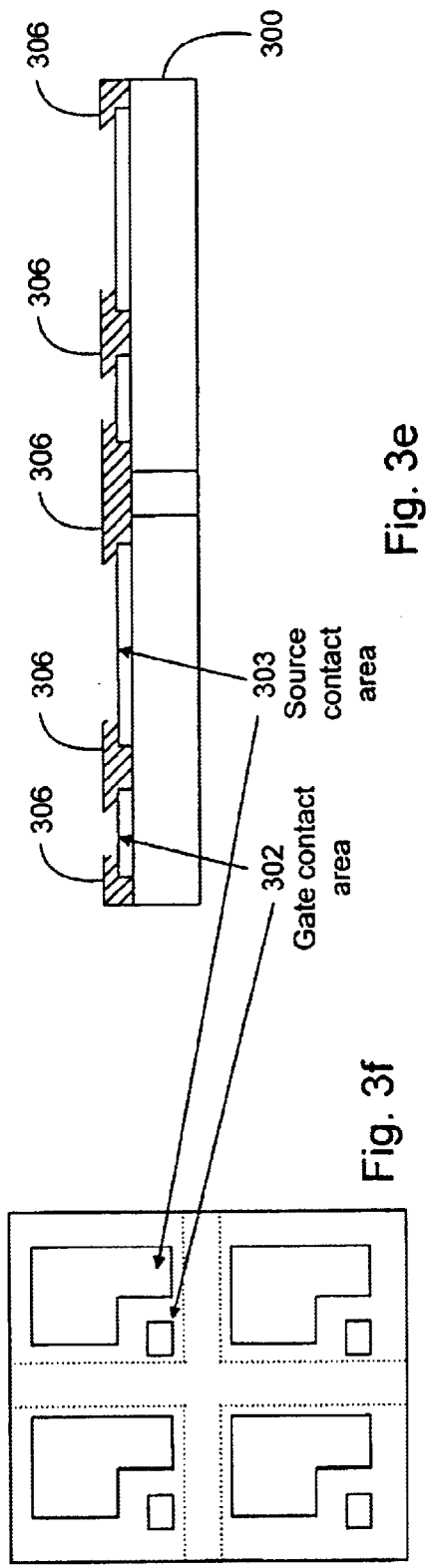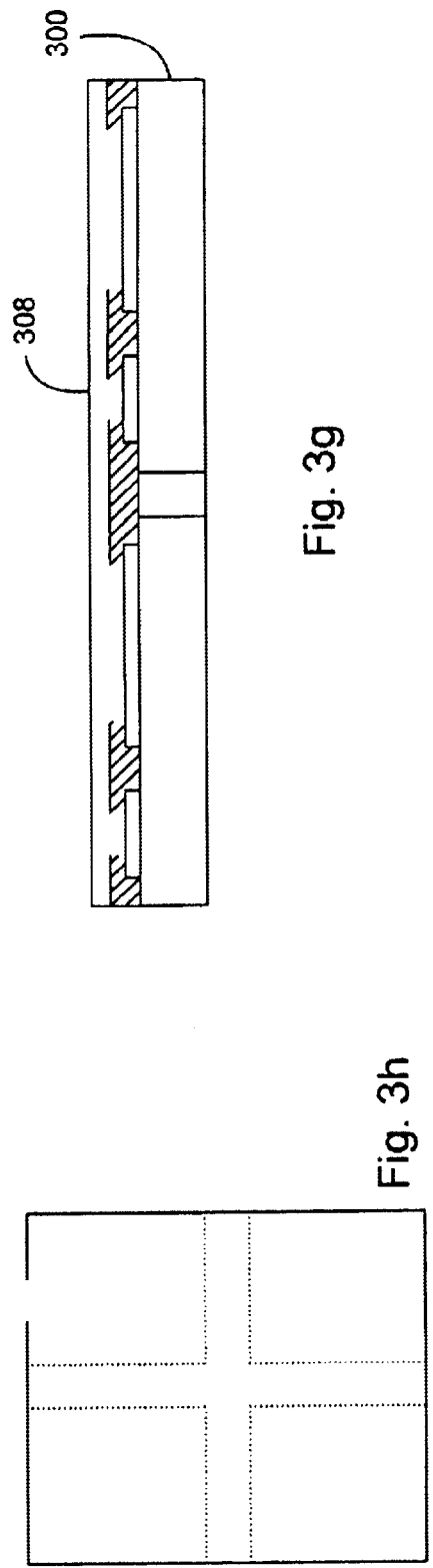

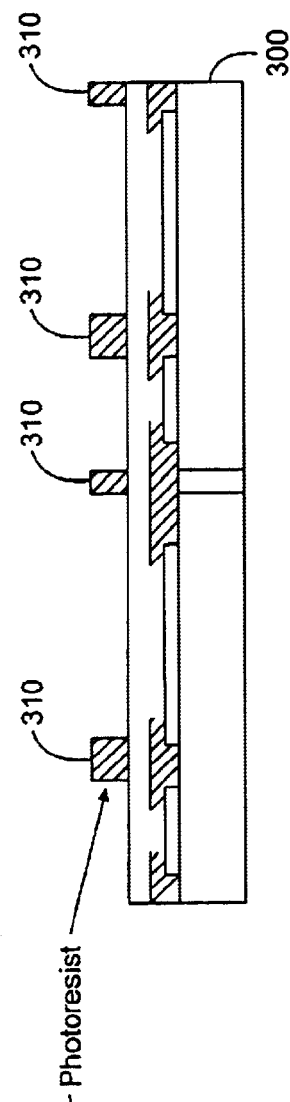
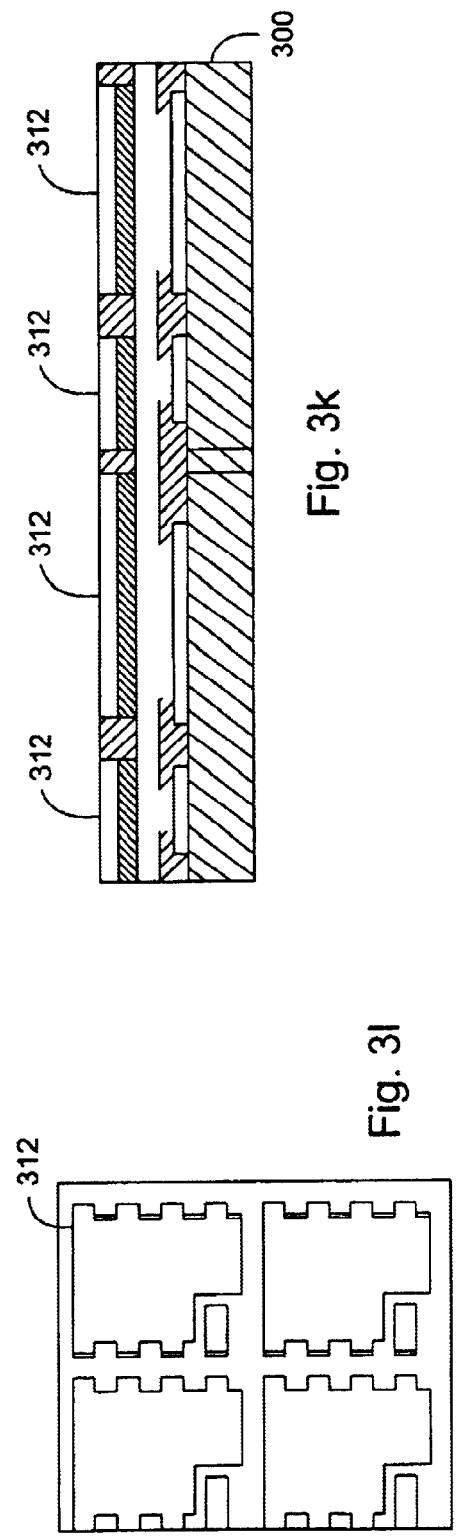
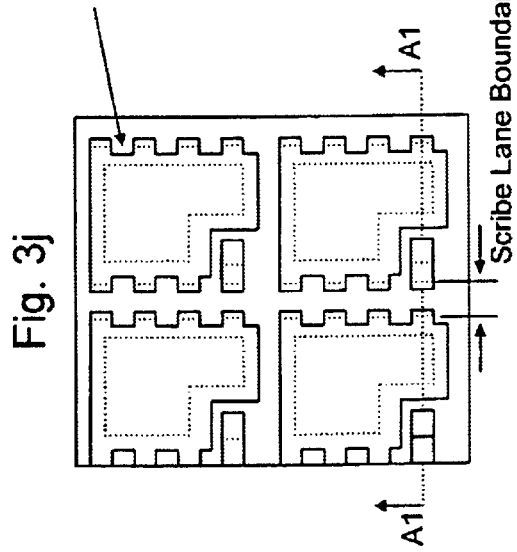

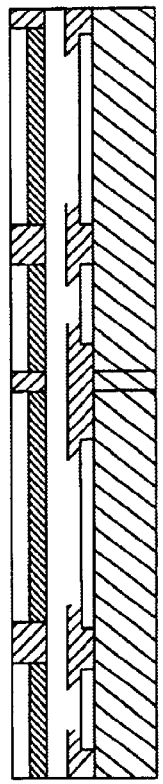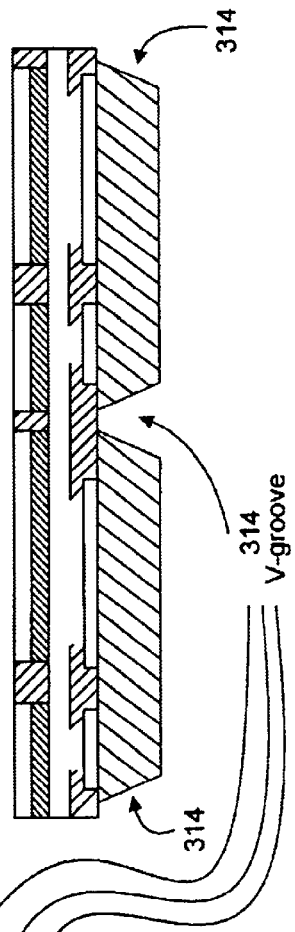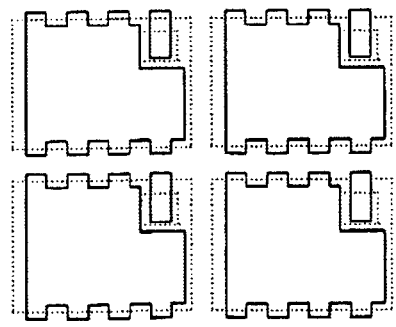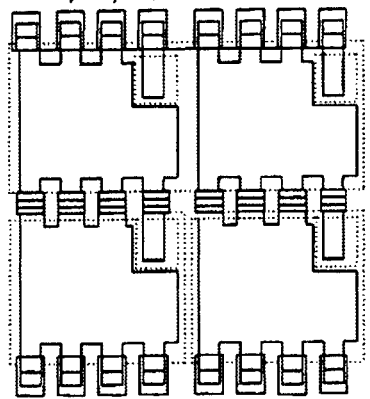

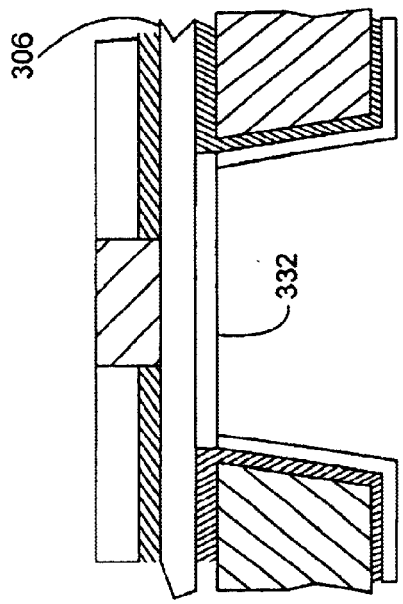
Fig. 3v
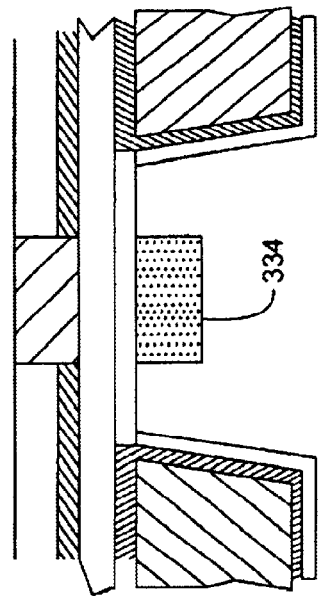
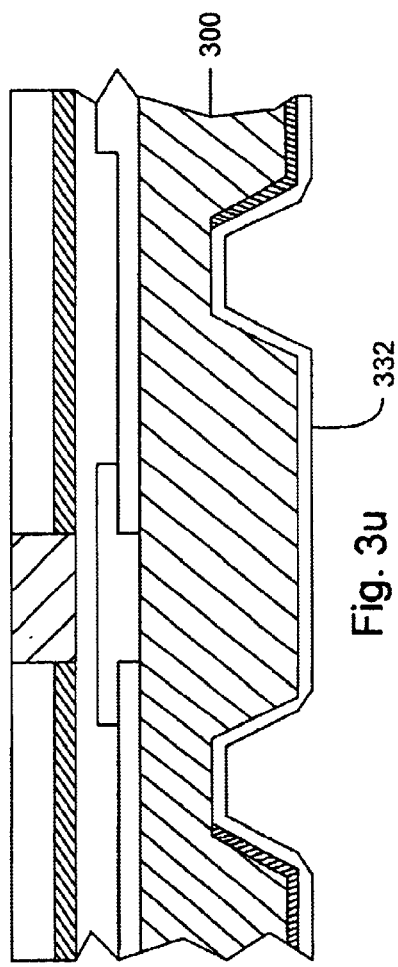
Fig. 3u
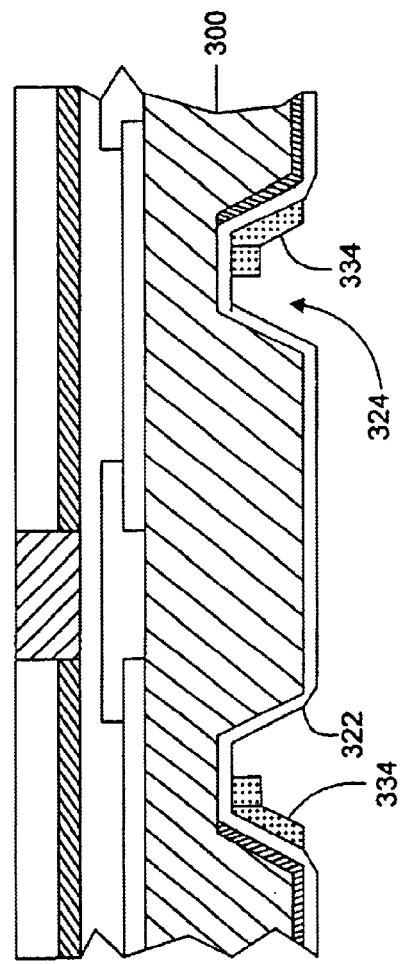
Fig. 3w

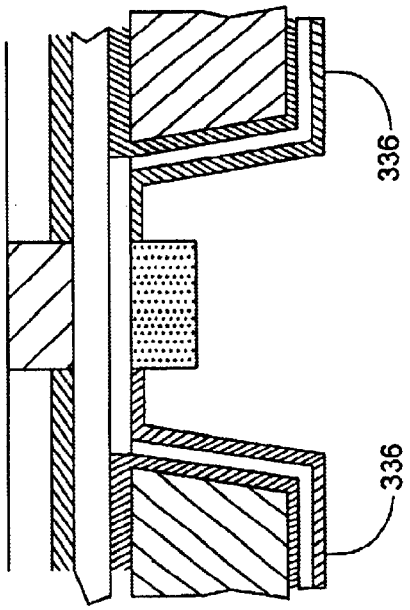
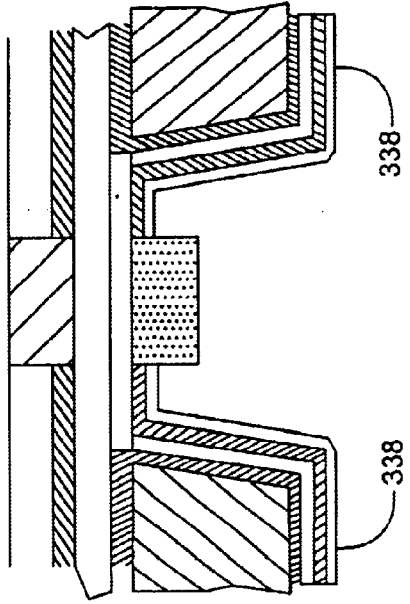
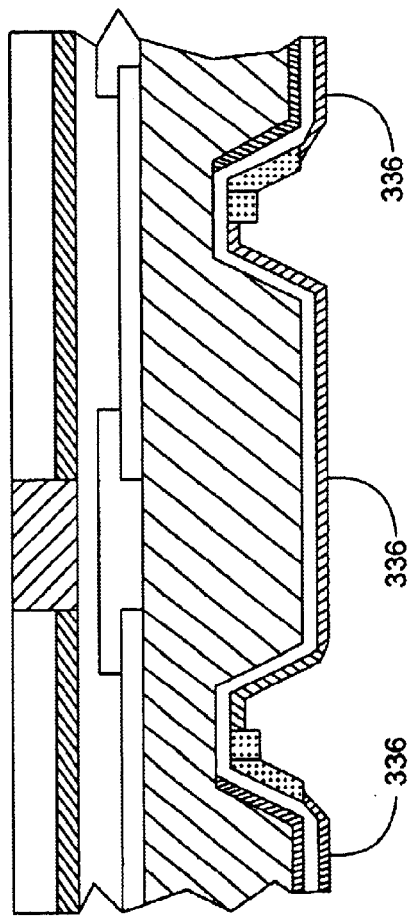
Fig. 3x
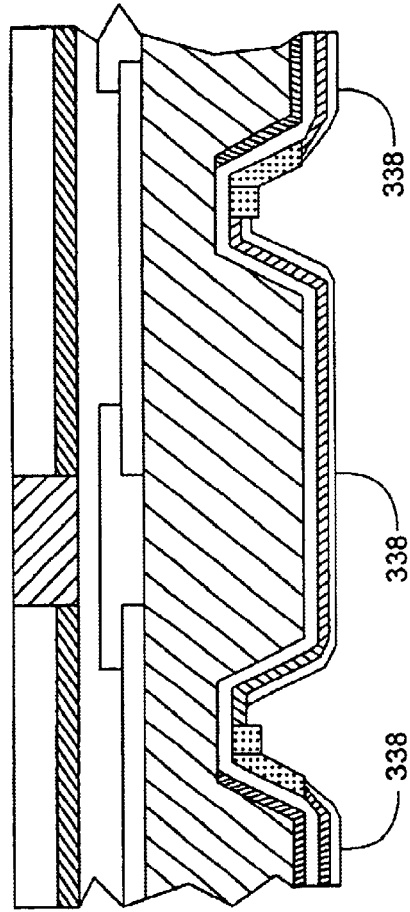
Fig. 3y

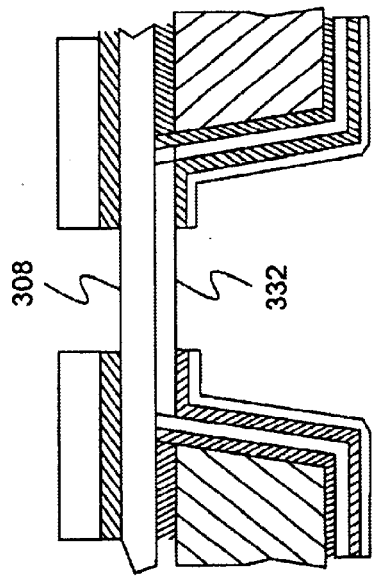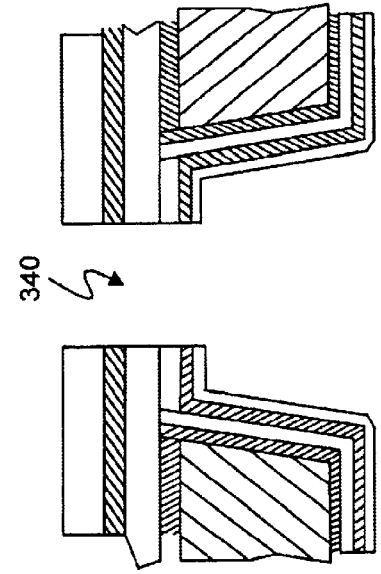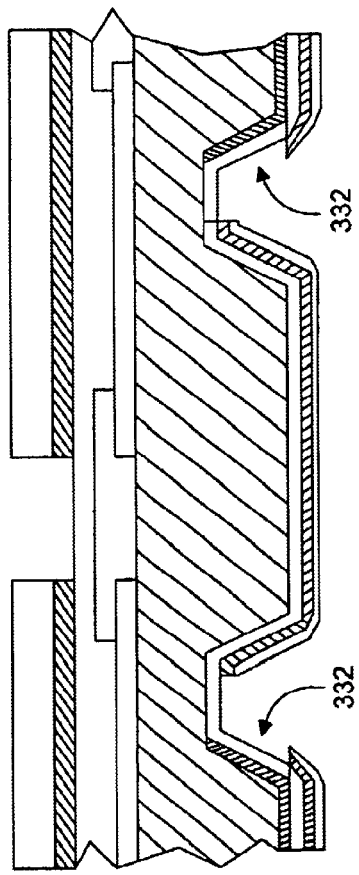
Fig. 3z
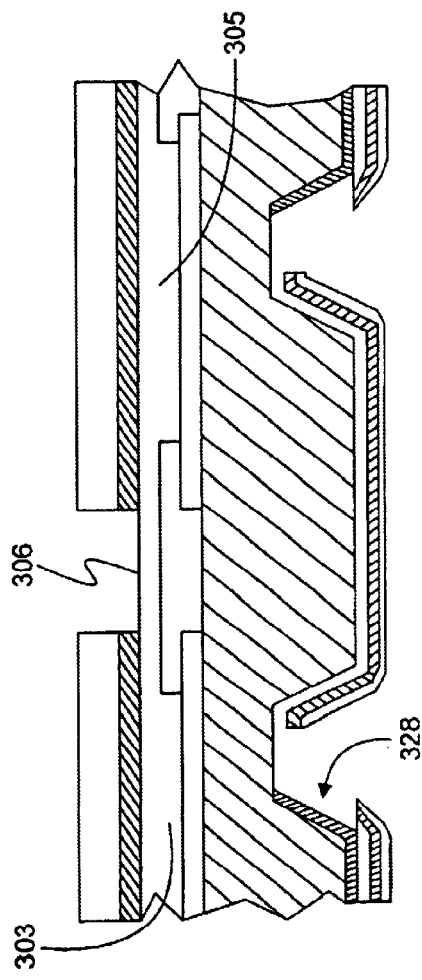
Fig. 3aa

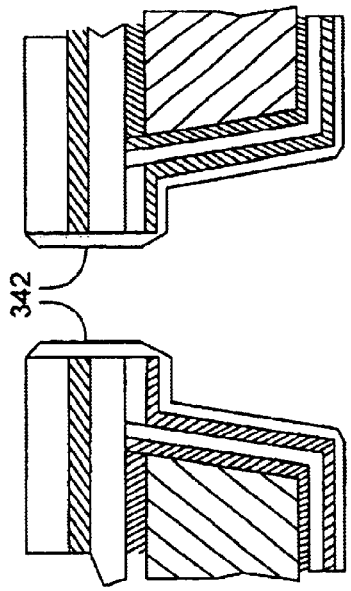
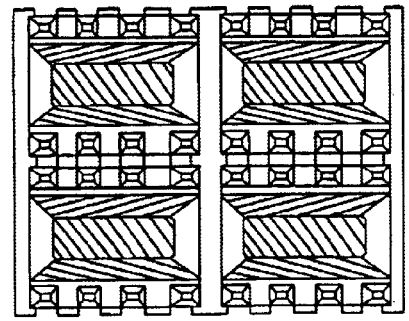
Fig. 3dd
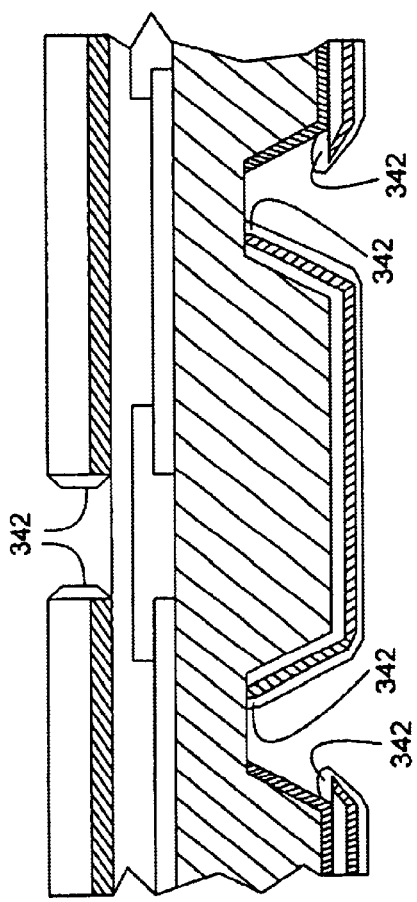
Fig. 3bb
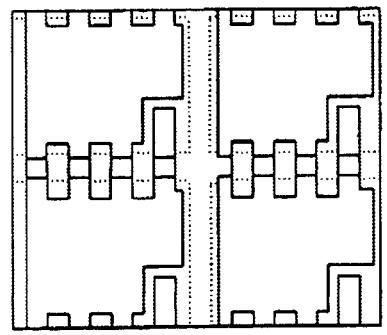
Fig. 3cc

US 6,867,489 B1

SEMICONDUCTOR DIE PACKAGE PROCESSABLE AT THE WAFER LEVEL

CROSS-REFERENCES TO RELATED APPLICATIONS

This application claims the benefit of the filing date of U.S. Provisional Patent Application No. 60/351,728, filed Jan. 22, 2002. This U.S. Provisional Patent Application is herein incorporated by reference in its entirety.

BACKGROUND OF THE INVENTION

The present invention generally relates to semiconductor packaging and more specifically to an apparatus and method of manufacture of a package for a three terminal device.

One type of semiconductor die package is for a horizontal MOSFET. The package that has source, drain, and gate contacts on one side of the die. In a typical way of forming a semiconductor die for a horizontal MOSFET, drain regions are formed on the same side as the gate and source regions. Because the drain, gate, and source regions are found on the same side of a semiconductor die, contacts for the regions may be formed on one side of the die. In turn, the semiconductor die can be directly mounted onto a circuit substrate with all three contacts contacting the circuit substrate. While producing the semiconductor package for the above semiconductor die is relatively straight forward, the die includes many disadvantages. For example, growing the drain, gate, and source connections on the same side reduces the effective area of the source and also limits the area in which drain contacts may be found. This results in a high "on resistance" (RDSon) per footprint area and also poor thermal performance due to limited drain contacts.

Semiconductor devices have been developed that may include a source region and a gate region on a first side of a semiconductor die and a drain region on a second side that is opposite from the source and gate region. These devices are "vertical" since current passes vertically through the semiconductor die. If the source/gate and drain region contacts are formed on opposite sides of a semiconductor die, the semiconductor die cannot be directly mounted onto a circuit substrate with all three contacts contacting the circuit substrate.

Thus, there is a need for a semiconductor package to address these and other problems individually and collectively.

BRIEF SUMMARY OF THE INVENTION

Embodiments of the present invention relate to semiconductor packaging.

In one embodiment, a method for forming a semiconductor die package is provided. The method comprises: forming a semiconductor die including a source contact region and a gate contact region at a first side and a drain contact region at a second side; forming a first conductive path on the semiconductor die extending from the source contact region at the first side to the second side; forming a second conductive path on the semiconductor die extending from the gate contact region at the first side to the second side; and attaching the semiconductor die to a circuit substrate so that the second side is proximate to the circuit substrate and the first side is distal to circuit substrate.

In another embodiment, a semiconductor die package is provided. The package comprises: a circuit substrate comprising one or more conductive regions; a semiconductor die including a source contact region and a gate contact region at a first side and a drain contact region at a second side; a first conductive path on the semiconductor die extending from the source contact region at the first side to the second side; and a second conductive path on the semiconductor die extending from the gate contact region at the first side to the second side, wherein the semiconductor die is mounted to the circuit substrate so that the second side is proximate to the circuit substrate and the first side is distal to circuit substrate, wherein the first conductive path is coupled to a conductive region in the one or more conductive regions and the second conductive path is coupled to a conductive region in the one or more conductive regions.

A further understanding of the nature and advantages of the invention herein may be realized by reference of the remaining portions in the specifications and the attached drawings.

BRIEF DESCRIPTION OF THE DRAWINGS

FIG. 1a shows a semiconductor package according to one embodiment of the present invention;

FIG. 1b shows a back side of the semiconductor package according to one embodiment of the present invention;

FIGS. 2a–2h depict cross-sectional views of a semiconductor die in a method for forming a semiconductor package according to one embodiment of the present invention;

DETAILED DESCRIPTION OF THE INVENTION

Figure 2A:
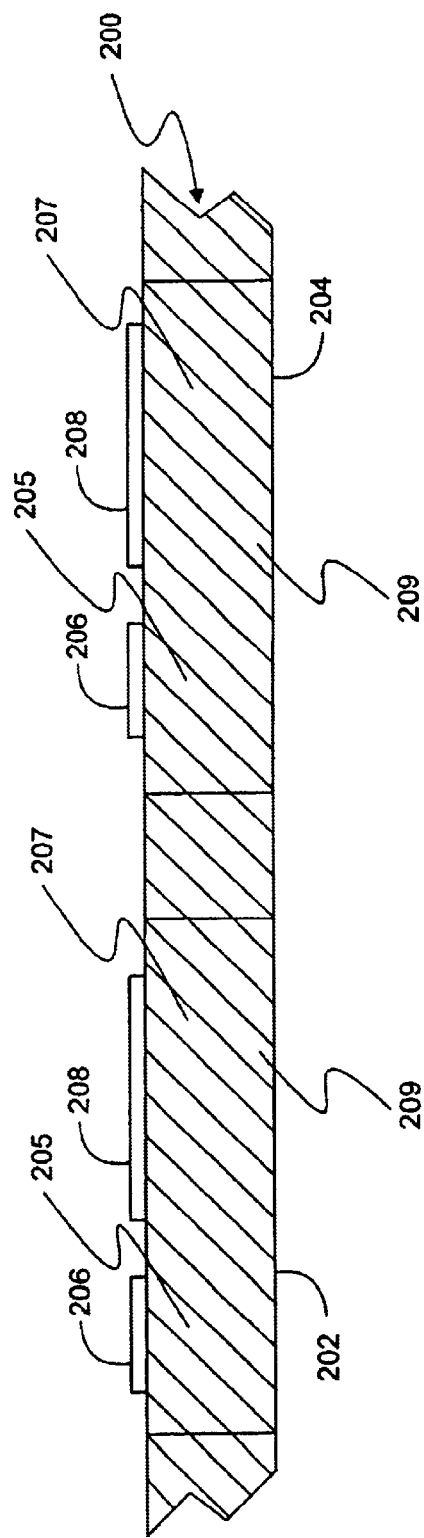

In embodiments of the present invention, a package for a device with gate and source regions formed on an opposite side from a drain region can be made feasible with this proposed packaging configuration and assembly methodology. It makes use of the standard wafer layout for wirebonded devices. Gate and source contact layout can be varied depending on the device application requirement; that is, a gate pad can be situated on the center of the die to enhance device performance. The process involves a top metal and bottom metal processing to transfer the gate and source contacts to the die back side effectively moving the gate and source contacts to be in the same plane with the drain contacts. Also, gate-to-drain and source-to-drain shorting is avoided by isolating the gate and source from the drain while maintaining functionality of these three terminals on the same plane. This isolation is achieved by the selective formation of grooves to define the gate, source, and drain contacts.

As used herein, the semiconductor die packages can include any suitable number of semiconductor dies mounted to any suitable circuit substrate of any suitable size. Embodiments of the invention are preferably "chip scale packages", where the size of the semiconductor die package is close to or equal to the size of the semiconductor die itself.

Embodiments of the present invention have many advantages. For example, lower RDSon performance is provided because the source area is maximized. The source and gate contact area layout can be variable. Gate, drain, and source contacts on the back side of the semiconductor die can be configured to be compatible with 0.5 mm pitch BGA (ball-grid array)-type layout, with little or no effect on effect on the expected thermal performance of the device. Also, solder bumps are eliminated and the contact structure is so-designed to facilitate solder capillary action for better joint reliability.

Embodiments of the present invention disclose a solder plating process that ensures enough thickness of the metallization to function at high current applications. Also, convention packages are only applicable to two terminal devices; whereas, embodiments of the present invention provide a packaging method for a three terminal device, such as a MOSFET and transistor. Further, conventional packages make use of a compliant post for contact stand-off while embodiments of the present invention disclose mesa structure contacts that create the contact on the silicon itself. This geometry promotes capillary action of the solder during substrate mounting for better joint reliability.

FIG. 1a shows a semiconductor package 100 according to one embodiment of the present invention. A semiconductor die 102 includes a gate region 104, a source region 106, and a drain region 108.

As shown, gate region 104 and source region 106 have been formed on a first side of semiconductor die 102 and drain region 108 has been formed on a second, opposite side of semiconductor die 102. In one embodiment, semiconductor die 102 is a transistor that may include a vertical power transistor. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region and a gate. The device is vertical in that the source region and the drain region are at opposite surfaces of the semiconductor die. The gate may be a trench gate structure or a planer gate structure, and it is formed at the same surface as the source region. During operation the current flow from the source region to the drain region in a VDMOS device is substantially perpendicular to the die surfaces. In other embodiments the transistors and the semiconductor dies can be bipolar transistors. In these embodiments, one side of the semiconductor die can have an admitted region and a base region. The other side of the die may have a collector region.

Semiconductor die 102 includes a first conductive path 110 and a second conductive path 112. First conductive path 110 extends from gate region 104 found at the first side of semiconductor die 102 to the second side of semiconductor die 102. As shown, conductive path 110 extends around a first edge 111 to provide a conductive path from the first side to the second side. Conductive path 112 also extends from a first side of semiconductor die 102 to the second side of semiconductor die 102. Conductive path 112 extends over a second edge 113 to provide a conductive path from the first side to the second side. Conductive paths 110 and 112 may be formed by any conductive substance. For example, a metallic substance such as solderable metallizations may be used to form the conductive paths 110 and 112.

In one embodiment, conductive path 110 and conductive path 112 are isolated by selective formation of grooves 114 so that gate to drain and source to drain shorting is avoided while maintaining the functionality of including the three contacts for the source, gate, and drain on the same plane. The selective formation of grooves 114 also serve to define the gate, source and drain contacts. Because the drain, gate, and source contacts have been provided on the same plane, one side of semiconductor die 102 may be mounted on a substrate 116 with the drain, gate, and source contacts contacting substrate 116. Thus, even though gate region 104 and source region 106 and their respective contacts have been formed on a side distal to the side proximate to substrate 116, conductive paths 110 and 112 allow gate and source contacts to be on the same plane as the drain contact.

FIG. 1b shows a back side of semiconductor package 100 according to one embodiment of the present invention. As shown, a gate contact 150, source contacts 152, and drain contact 154 are provided. Gate contact 150, source contacts 152, and drain contact 154 are included on the same plane even though gate region 104 and source region 106 have been formed on the opposite side from drain region 108. Solderable contacts 156 correspond to conductive path 110 and conductive path 112. Solderable contacts 156 provide a conductive path to the side where drain region 108 was formed. Also, BCB is retained in an area to guarantee isolation between source contact 152/gate contact 150 and drain contact 154.

As shown, gate contact 150 is formed in a mesa structure. The mesa structure is formed by forming grooves between gate contact 150 and source contacts 152. As shown, source contacts 152 are a plurality of mesas; however, source contact 152 may be a single mesa. In one embodiment, drain contact 154 is formed as a single mesa. Drain contact 154, however, may be formed using a plurality of mesas or an array of mesas as will be described below. The mesas are selectively formed by forming grooves in semiconductor die 102, such as grooves 114.

FIGS. 2a–2h depict a simplified method for forming a semiconductor package according to one embodiment of the present invention. FIG. 2a shows a standard wafer 200 using a standard mask layout (for wire bonded devices) in one embodiment. In one embodiment, a thick or thin (8 mils) wafer may be fed through the flow. As shown, a first semiconductor die 202 and a second semiconductor die 204 may be produced by the following flow. Although only two semiconductor dies are shown, it will be understood that any number of dies may be produced and that any number of dies may be included in a semiconductor package.

As shown, semiconductor dies 202 and 204 include a gate region 205, a source region 207, and a drain region 209. Gate region 205 and source region 207 are included on a first side and drain region 209 is included on a second side that is opposite from the first side. A gate contact 206 and a source contact 208 is also included on the first side. The following description will now be described with respect to semiconductor die 202; however, it will be understood that the description will apply to semiconductor die 204 and any other dies in wafer 200.

Figure 2B:
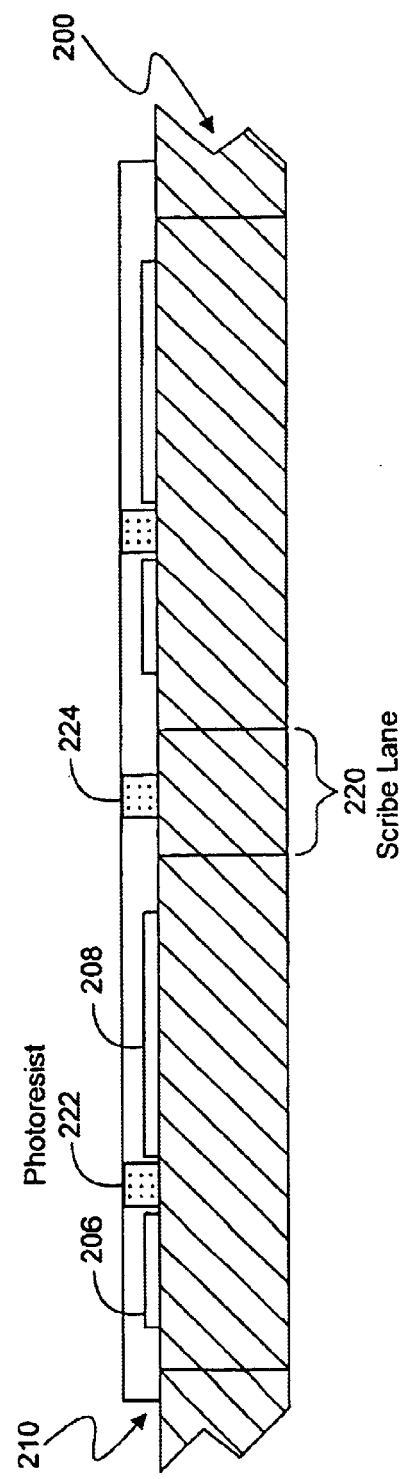

FIG. 2b shows a metallization 210 provided on top of wafer 200. In one embodiment, the topmost layer is a solder. As shown, the coverage of metallization 210 extends to a scribe lane area 220. Scribe line area 220 is where semiconductor die 202 and semiconductor die 204 will be separated. Photoresist 224 is deposited in an area above scribe lane 220 and in between semiconductor die 102 and semiconductor die 104. Photoresist 224 is used to allow semiconductor die 102 and semiconductor die 104 to be separated in a process described below. Also, photoresist 222 is deposited on wafer 200 in between metallization 210 to separate and define gate contact 206 and source contact 208.

FIG. 2c illustrates a pattern of grooves that define areas to form gate, source, and drain contact regions on the bottom side of wafer 200. As shown, a first groove 230 is formed to define a back side gate contact region 229 and a back side drain contact region 231. Additionally, a groove 232 is formed to define back side drain contact region 231 and a back side source contact region 233. A scribe lane groove 234 is also formed to separate semiconductor die 202 and semiconductor 204.

FIG. 2d shows wafer 200 with grooves that have been created. As shown, grooves 240 and 242 have been created to form the back side contact regions for the gate, drain and source. In one embodiment, water laser jets are used to create the grooves. A laser etch, wet etch, or dry etch could alternatively be used to create the grooves also. Additionally, a groove 244 has been created in scribe lane area 220 that exposes the metallizations and photoresist previously deposited.

FIG. 2e illustrates wafer 200 with a benzocyclobutene (BCB) coating. As shown, a BCB coating 250 covers a first edge 252, a first bottom area 254, and a first groove edge 256. This BCB coating 250 is used to isolate the gate contact region 229 from the drain contact region 231. Additionally, a BCB coating 257 is found on a second edge 258, a second bottom area 260, and a second groove edge 262. This BCB coating 257 is used to isolate source contact region 233 from drain contact region 231.

FIG. 2f shows a solderable metallization 270 deposited on wafer 200. Solderable metallization 270 is deposited on back side gate contact region 229, back side drain contact region 231, and back side source contact region 233. In one embodiment, the thickness of solder metallization 270 is thinner than the metallization 210 that was previously deposited in FIG. 2b.

Figure 2G:
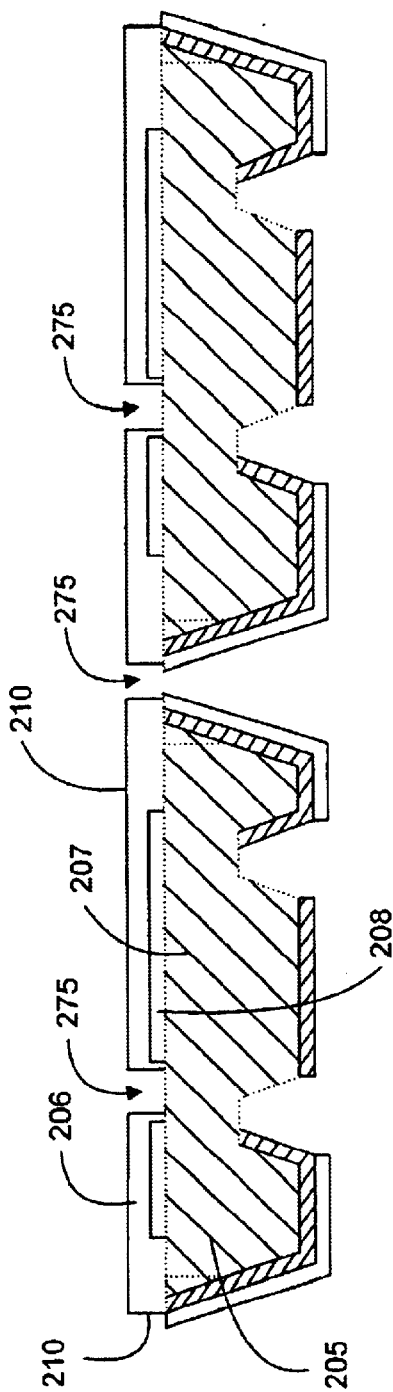

FIG. 2g illustrates wafer 200 after photoresist 222 and 224 have been removed. As shown, recesses 275 now exist where photoresist 222 and 224 were formerly deposited. Thus, a gap exists in metallization 210 between gate region 205 and source region 207. Accordingly, gate contact 206 and source contact 208 have been isolated from one another. Also, a gap exists between semiconductor die 102 and semiconductor die 104. In one embodiment, there can be a partial separation where the separation is not on the entire length of the width of the die.

Figure 2H:
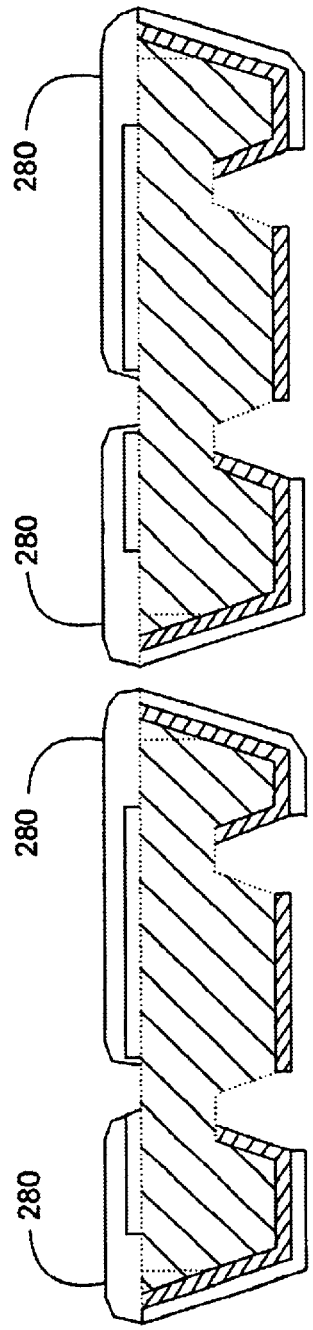

FIG. 2h illustrates a flux coat 280 that has been deposited on wafer 200. As shown, flux coat 280 is deposited on the top side and bottom side of wafer 200 to close the connections between solderable metalizations 270 and metallization 210. Closing the connections provides continuity of contact from the top metal to the bottom metallizations that have been deposited on wafer 200.

After flux coat 280 has been deposited on wafer 200, contacts have been effectively formed on the bottom side of wafer 200 for the gate region 205, drain region 209, and source region 207 of semiconductor die 202. Accordingly, semiconductor die 202 may be mounted on a substrate 116 with contacts for gate region 205, drain region 209, and source region 207 on the same plane even though gate region 205 and source region 207 have been formed on the opposite side of wafer 200 from drain region 209.

Figures 3A, 3B, 3C, 3D:
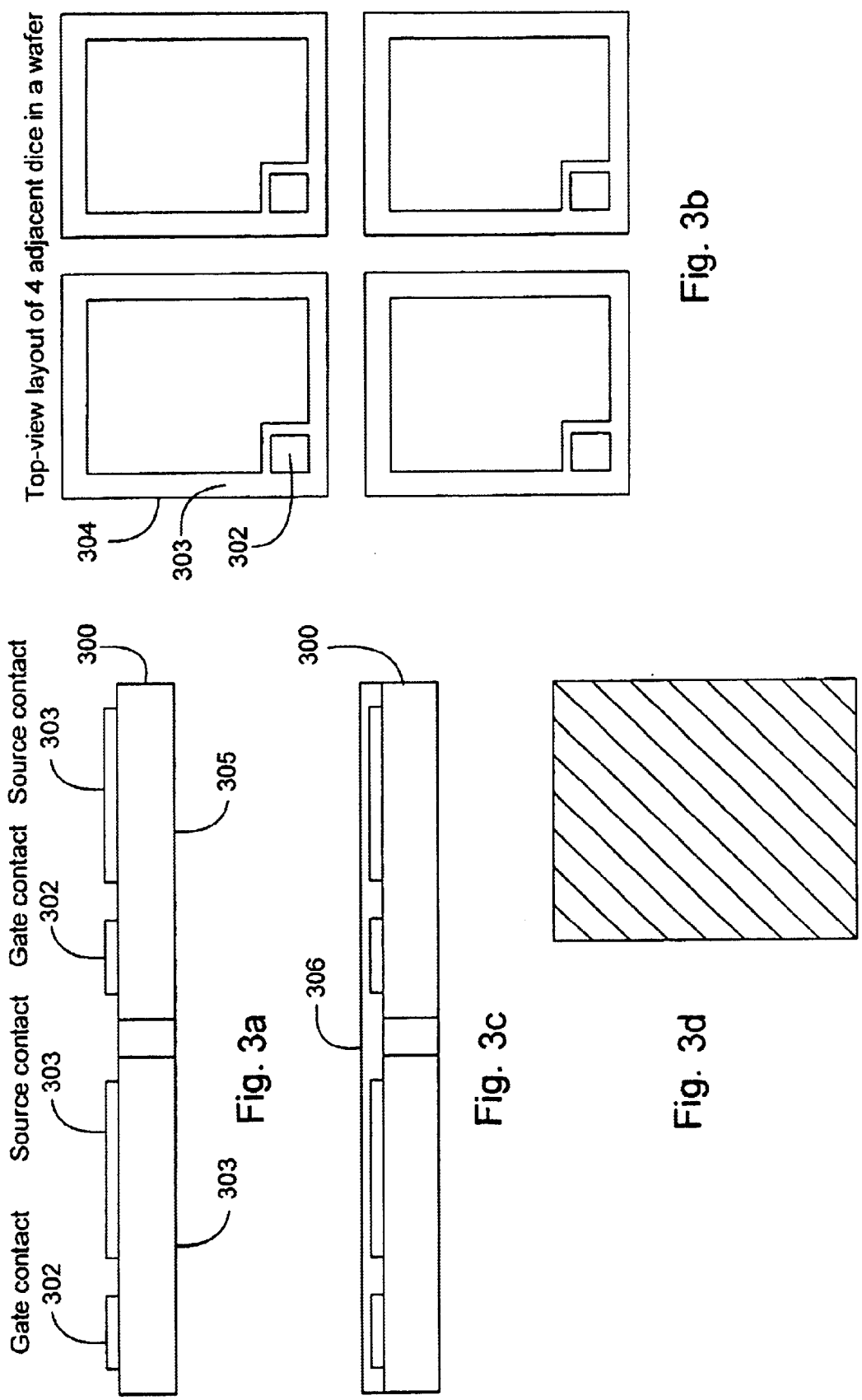
FIGS. 3a–3ff depict cross-sectional views for a detailed flow of processing a semiconductor package according to one embodiment of the present invention.

FIGS. 3a–3ff depict a detailed flow of processing a semiconductor package according to one embodiment of the present invention. FIG. 3a shows a wafer 300 that has been processed up to a backgrind; however, the backgrind may not be performed in some embodiments. In one embodiment, wafer 300 may be an eight mils thick wafer. Additionally, in one embodiment, wafer 300 may be backgrinded by a standard MOSFET wafer backgrind. As shown, wafer 300 includes a first semiconductor die 304 and a second semiconductor die 305. Wafer 300 also includes a gate contact 302 and a source contact 303 on a first side for both dies 303 and 305.

FIG. 3b shows the backside of wafer 300 having a plurality of semiconductor dies formed therein. As shown, four adjacent dice are included in wafer 300. As shown, gate contact 302 and source contact 303 are included on a die, such as semiconductor die 303 or 305.

FIG. 3c shows a BCB coating 306 that is used to coat the top layer of wafer 300. FIG. 3d shows the top layer view of BCB coating 306. As shown, BCB coating 306 covers the entire top layer of wafer 300. BCB coating 306 is used to guarantee the isolation between the source and gate contacts from the drain contact.

Figure 3Q:
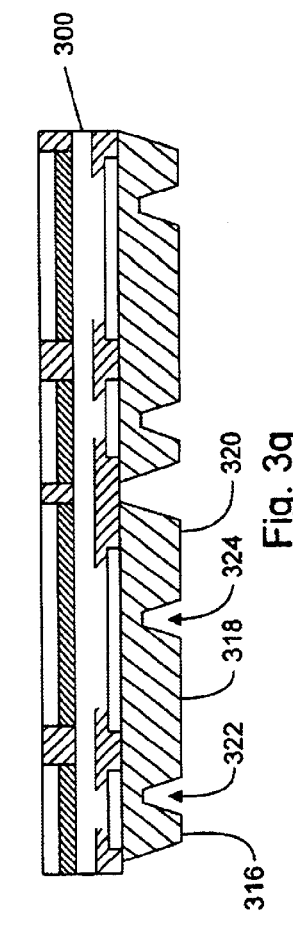
Figure 3S:
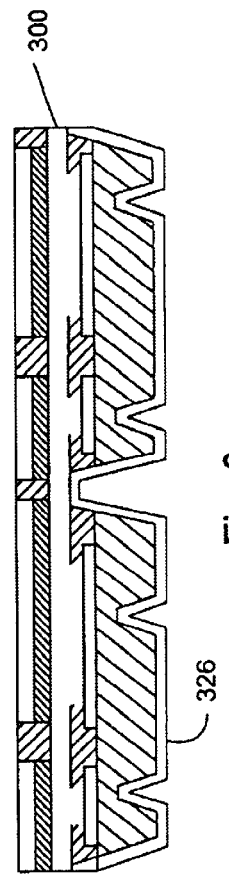
Figure 3T:
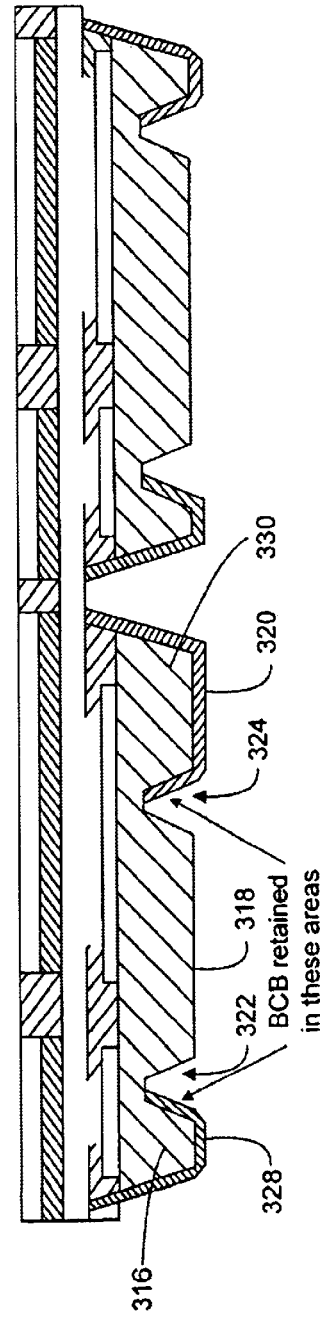
Figure 3R:
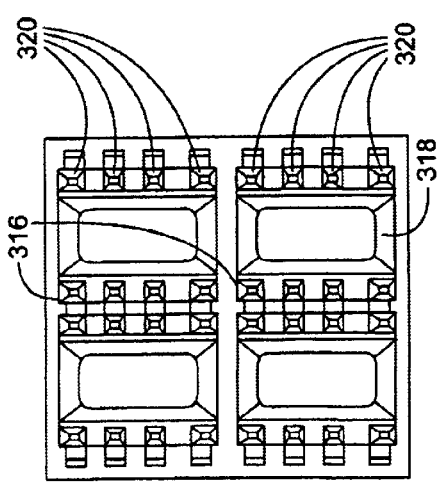
Figure 3F:
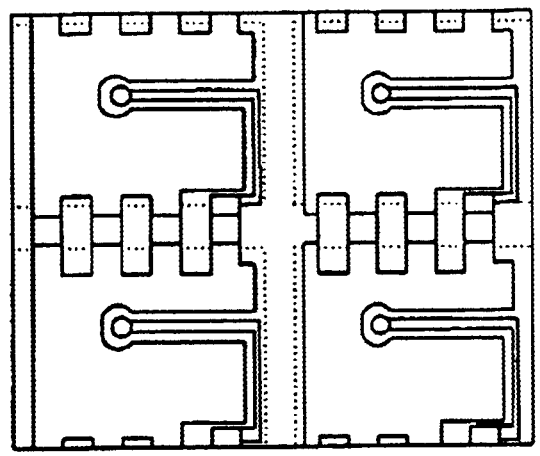
Figure 3E:
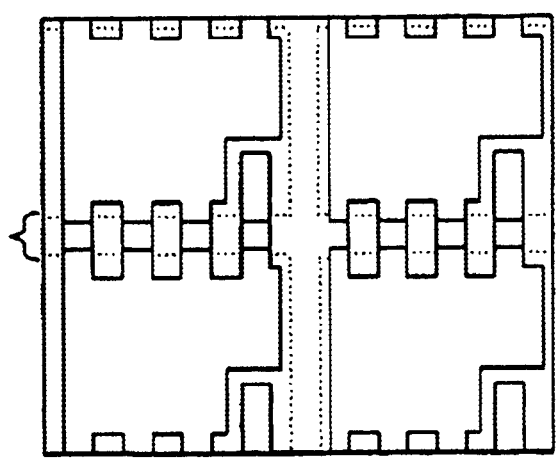

In FIG. 3e, photoresist has been deposited on wafer 300 except in areas where gate contact area 302 and source contact area 303 exist. Photoresist is developed and gate contact area 302 and source contact area 303 are defined as shown in FIG. 3e and FIG. 3f. BCB 306, however, still exists in certain areas on the top side of wafer 300 as shown. The remaining BCB 306 will be used to define the gate and source contact areas.

FIG. 3g illustrates a sputter seed layer 308 as deposited on wafer 300. In one embodiment, sputter seed layer 308 includes a TiCu or a TiNi substance. Sputter seed layer 308 is deposited in preparation for the undersolder metallurgy (USM) plating process. FIG. 3h illustrates the bottom side of wafer 300 after sputter seed layer 308 has been deposited.

FIG. 3i illustrates a photoresist coat 310 that has been selectively deposited on wafer 300. Photoresist coat 310 is deposited in areas in order to expose areas where the USM coverage is not needed. Thus, USM will be deposited in areas not covered by photoresist 310. FIG. 3j illustrates a backside view of wafer 300 with photoresist 310 deposited. As shown, photoresist 310 does not cover gate contact 302 and source contact 303.

FIG. 3k illustrates wafer 300 with a USM and solder plating layer 312 deposited on it. The liquidous temperature of this plated solder may be at least 40 degrees Celsius or higher than that of a board mounting solder. The board mounting solder is the solder that will be used to mount wafer 300 to a circuit substrate. FIG. 3l illustrates the back side of wafer 300 with USM layer 312 deposited. As shown, USM 312 covers the source and gate and contact regions of wafer 300. Thus, USM is used as a top side conductive layer for the source and gate contacts that will be connected to a back side conductive layer to form back side source and gate contacts.

FIG. 3m illustrates wafer 300 after a backgrind. In one embodiment, the backgrind step may backgrind the wafer to 8 mils. Although a backgrind is described, the backgrind may be optional if wafer 300 is already thin. FIG. 3n illustrates a back side view of wafer 300 after the backgrind.

FIG. 3o illustrates wafer 300 after a scribe lane groove 314 has been created. As shown, groove 314 is in the shape of a "V" with a slightly flattened end point; however, other groove shapes may be used. Scribe lane groove 314 is the area that divides a first semiconductor die from a second semiconductor die. In one embodiment, groove 314 may be created using a laser water jet. FIG. 3p shows the back side view with groove 314 shown in boxes 316.

FIG. 3q shows wafer 300 with V-grooving on the backside of wafer 300. The V-grooving on the back side of wafer 300 defines contact regions for a back side gate contact area 316, a backside drain contact area 318, and a back side source contact area 320. As shown, V-groove 322 separates back side gate contact area 316 from back side drain contact area 318. Also, a groove 324 separates back side drain contact area 318 from back side source contact area 320.

FIG. 3r shows a back side view of wafer 300 with V-grooving. In one embodiment, the shape of the contacts are in the form of a mesa structure or flat-top pyramid. As shown, back side drain contact area 318 is in the form of a single mesa structure. Drain contact area 318, however, may be in the form of an array of mesas as will be described in an alternative embodiment below. Back side gate contact area 316 is included as a single mesa and back side source contact area is included as a plurality of mesas. These mesas surround drain contact area 318. Although the above layout is shown, it will be understood that a person skilled in the art will appreciate other layouts of gate, drain, and source contact areas.

FIG. 3s shows a BCB coat 326 deposited on the back side on wafer 300. As shown, BCB coat 326 is deposited on the bottom area, sides, and V-grooves of wafer 300. BCB coat 326 is used in preparation for isolation of gate contact area 316 and source contact area 320 from drain contact area 318.

FIG. 3t illustrates a BCB coating in areas where isolation is needed from drain contact area 318. As shown, a BCB coat 328 is formed over gate contact area 316. BCB coat 328 extends from a first edge onto the bottom side of wafer 300 and on to a first edge of groove 322. Additionally, a BCB coat 330 extends from a second edge on to a bottom side of wafer 300 and then on to a first edge of a groove 324. In one embodiment, BCB coats 328 and 330 are retained in those areas by depositing and developing photoresist in those areas.

FIG. 3u illustrates a sputter seed layer 332 deposited over the back side of wafer 300 for bottom metallization. In one embodiment, sputter seed layer 332 includes a TiCu or TiNi metal.

FIG. 3v shows the view of scribe lane groove 314 where contact of sputter seed layer 332 and BCB coating 306 shows continuity of the connection because the metal layers are connected.

FIG. 3w illustrates a photoresist coat 334 on wafer 300. Photoresist coat 334 is used to expose areas where USM and solder shall be plated. As shown, photoresist 334 is placed on the sides of groove 322 and 324 and also in the middle of scribe area. Thus, USM and solder will not be placed in these areas. Accordingly, gate contact area 316 and source contact area 320 will be isolated from drain contact area 318 because conductive metal will not be present between the areas.

FIG. 3x illustrates USM plating 336 deposited on wafer 300. As shown, USM plating covers the entire bottom side of wafer 300 except for where photoresist coat 334 has been deposited. In one embodiment, a USM plating is a metallic substance, such as copper or nickel substance.

FIG. 3y shows a solder plating 338 deposited on wafer 300. Solder plating 338 is deposited on top of USM plating 336. Solder plating 338 and USM plating 336 form the back side contacts for gate contact area 302 and source contact area 303 that have been formed on the top side of wafer 300. The back side contacts will be directly mounted to a circuit substrate and form contacts for the gate, drain, and source region that are on the same plane. In one embodiment, solder plating 338 and USM plating 336 are of the same composition of USM and solder plating 312 (the metal that has been deposited on the top side of wafer 300 in FIG. 3k). In one embodiment, the thickness of the solder plating 338 and USM plating may be thinner than USM and solder plating 312. Solder plating 338 should be thinner for better control on the plating coverage, particularly in the area of scribe lane groove 314. If the solder thickness is not controlled, full coverage of the area in scribe lane groove 314 may result and sawing through the solder may induce mechanical stress on the solder and USM structure that may possibly lead to delamination of the USM or BCB from the mesa structures.

FIG. 3z illustrates wafer 300 with photoresist 310 and 334 removed from the top and bottom side of wafer 300. With photoresist 310 and 334 removed, sputter seed layers 308 and 332 are exposed on the top and bottom of wafer 300. Now that sputter seed layers 308 and 332 have been exposed, they can be removed. FIG. 3aa shows sputter seed layer 308 and sputter seed layer 332 removed from the top and bottom side of wafer 300. As shown, BCB 306 and BCB 328 have been exposed because the sputter seed layer 332 covering it has been removed. Also, in scribe lane groove 314, an aperture 340 has been formed to separate the first semiconductor die 303 from the second semiconductor die 305. Additionally, removing sputter seed layer 308 has separated gate contact 302 from source contact 303.

FIG. 3bb shows a flux coat and reflow 342 used to close the connections on die 303. Flux coat and reflow 342 closes the solder connection for solder plating 338 and USM plating 336 and USM and solder plating 312.

FIG. 3cc is a top view of four adjacent dice in wafer 300 as formed by the above process. FIG. 3dd illustrates a back side view of four adjacent dice of wafer 300. The back side view illustrates the mesa structures that are formed by the above described process.

FIG. 3ee shows a top view that show the maximizing of the source contact region. As shown, the source contact region extends to a scribe lane area. Also, upon removal of the photoresists, the scribe lane area will have rectangular through holes.

FIG. 3ff shows a variation of the gate contact area. The gate contact location can be varied depending on device requirements. As shown, the gate contact area in the center of the die.

Using the above process, a conductive path is generated for a gate and source region from the top side of a die to the bottom side of the die. Additionally, a drain contact region is formed on the bottom side of the die. Thus, using the conductive path, a gate contact region, a source contact region, and a drain contact region are effectively formed on the same plane in wafer 300 even though the gate and source contacts were formed on an opposite side as the side that is proximate to a circuit substrate that the die is mounted on. Thus, the die may be directly mounted on a circuit substrate with the gate, drain, and source contact regions on the same plane.

Figure 4A:
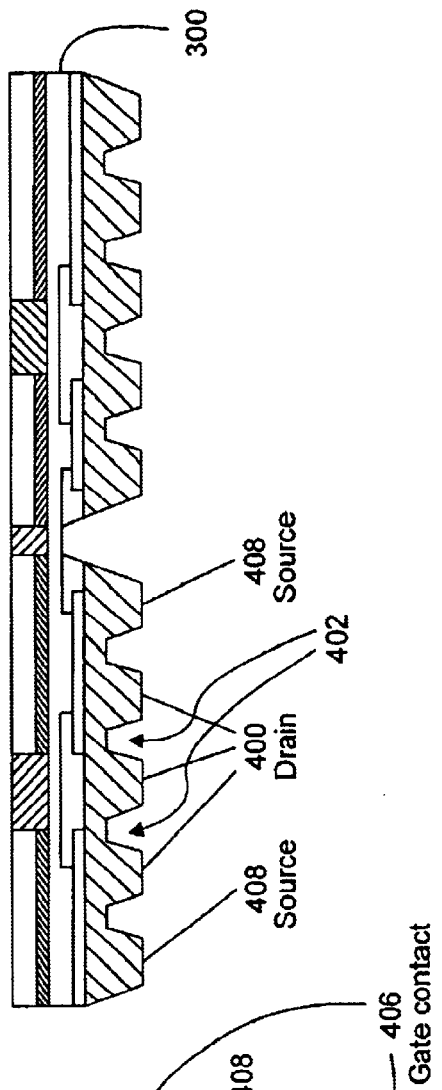
FIG. 4a illustrates an alternative embodiment for a drain contact region according to one embodiment of the present invention.
Figure 4B:
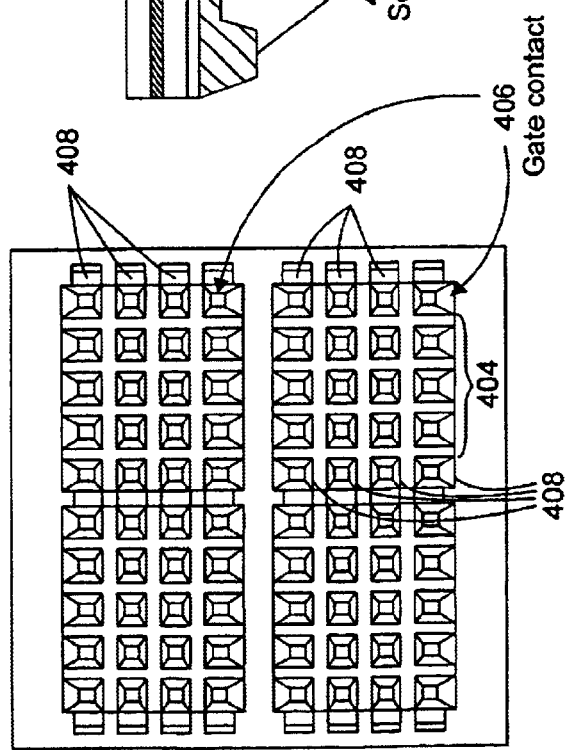
FIG. 4b illustrates an array of mesas for the drain contact region.

FIG. 4a illustrates an alternative embodiment for a drain contact region 400 according to one embodiment of the present invention. As shown, drain contact region 400 includes a plurality grooves 402. The plurality of grooves form an array of mesas on the back side of wafer 300. For example, FIG. 4b illustrates an array of mesas 404 for drain contact region 400. Also shown are gate contacts 406 and source contacts 408. The selective V-grooving on the back side of wafer 300 is used to define contact regions for the gate, source, and drain regions. Forming mesa structures and specifically, an array of mesas, provides many advantages. For example, full drain contact to the board (without the mesa structures) can be stressful to the die due to coefficient of thermal expansion mismatch. Using array of mesas 404 for the drain area will minimize the stress associated with the coefficient of thermal expansion (CTE) mismatch. This is also the reason for the array of mesas on source contacts 408 instead of having one long mesa contact.

Figure 5:
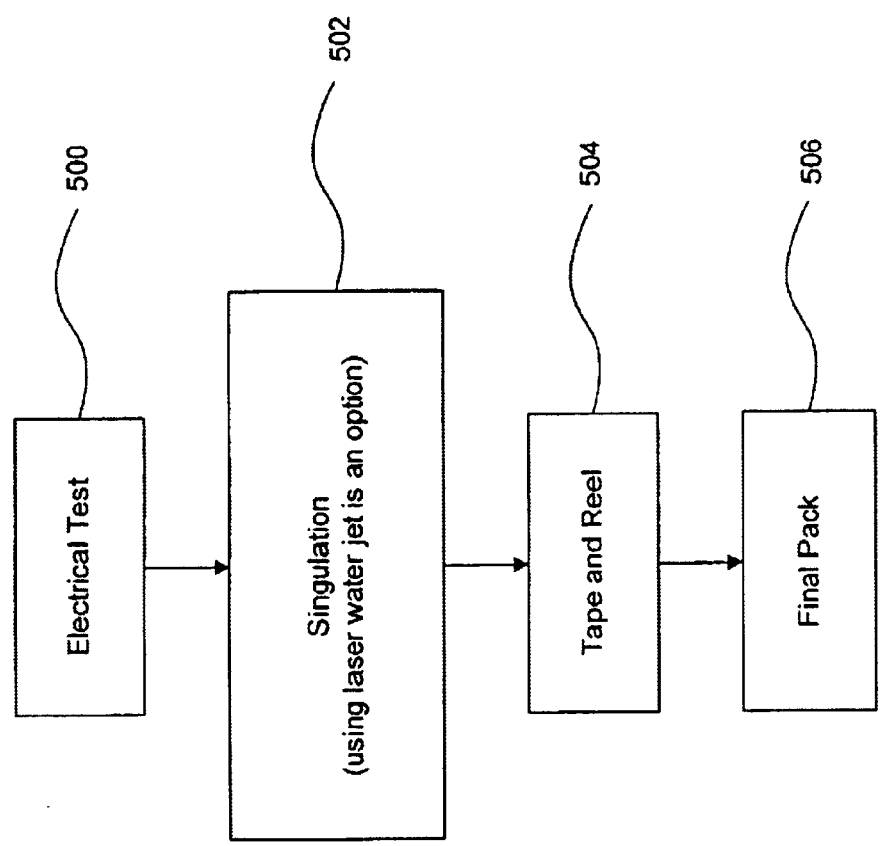
FIG. 5 illustrates the method for an assembly for a semiconductor package according to one embodiment of the present invention.

FIG. 5 illustrates the method for an assembly for a semiconductor package according to one embodiment of the present invention. In step 500, an electrical test is performed. The electrical test may be performed because the three terminals of the semiconductor die are isolated in wafer form, making it impossible to do the electrical testing prior to individually cutting the dies with a die saw.

In step 502, a singulation step is performed. In one embodiment, a laser water jet may be used instead of a die saw. In the singulation step, dies are individually separated.

In step 504, a tape and reel is performed. In this step, the dies are attached on a tape and rolled onto a reel.

In step 506, the tape and reel is finally packed and is ready for shipment.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A semiconductor die package comprising:
   a circuit substrate comprising one or more conductive regions;
   a semiconductor die including a source contact region and a gate contact region at a first side and a drain contact region at a second side;
   a first conductive path on the semiconductor die extending from the source contact region at the first side to the second side; and
   a second conductive path on the semiconductor die extending from the gate contact region at the first side to the second side,
   wherein the semiconductor die is mounted to the circuit substrate so that the second side is proximate to the circuit substrate and the first side is distal to circuit substrate, wherein the first conductive path is coupled to a conductive region in the one or more conductive regions and the second conductive path is coupled to a conductive region in the one or more conductive regions.

2. The semiconductor die package of claim 1, wherein the semiconductor die includes an array of drain contact structures.

3. The semiconductor die package of claim 2, wherein the drain contact structures are in the form of mesas.

4. The semiconductor die package of claim 1, wherein the semiconductor die includes an one or more source contact structures.

5. The semiconductor die package of claim 4, wherein the one or more source contact structures are in the form of mesas.

6. The semiconductor die package of claim 1, wherein the semiconductor die includes an one or more gate contact structures.

7. The semiconductor die package of claim 6, wherein the one or more gate contact structures are in the form of mesas.

8. The semiconductor die package of claim 1, wherein the conductive path comprises a metallic substance.

9. The semiconductor die package of claim 8, wherein the metallic substance comprises a solder.

10. The semiconductor die package of claim 1, wherein the semiconductor die comprises a MOSFET.

11. The semiconductor die package of claim 1, wherein the first conductive path extends from the first side over a first edge to the second side.

12. The semiconductor die package of claim 11, wherein the second conductive path extends from the first side over a second edge to the second side.

13. A semiconductor die package comprising:
    a circuit substrate comprising one or more conductive regions;
    a semiconductor die including a source contact region and a gate contact region at a first side and a drain contact region at a second side;
    a first groove formed on the second side;
    a first conductive path extending from the source contact region at the first side to the first groove on the second side;
    a second groove formed on the second side;
    a second conductive path extending from the gate contact region at the first side to the second groove on the second side;
    wherein the semiconductor die is mounted to the circuit substrate so that the second side is proximate to the circuit substrate and the first side is distal to circuit substrate, wherein the first conductive region is coupled to a conductive region in the one or more conductive regions and the second conductive region is coupled to a conductive region in the one or more conductive regions.

14. The semiconductor die package of claim 13, wherein the first groove is selectively formed so that the first conductive path will form a source contact region that is isolated from a drain contact region on the second side.

15. The semiconductor die package of claim 13, wherein the second groove is selectively formed so that the second conductive path will form a gate contact region that is isolated from a drain contact region on the second side.

16. The semiconductor die package of claim 13, wherein the first conductive path extends from the first side over a first edge to the second side.

17. The semiconductor die package of claim 16, wherein the second conductive path extends from the first side over a second edge to the second side.

18. A semiconductor die package comprising:
    a circuit substrate comprising one or more conductive regions;
    a semiconductor die including a source contact region and a gate contact region at a first side of the die and a drain contact region at a second side of the die, wherein the semiconductor die has a first edge surface and a second edge surface;
    a first conductive path on the semiconductor die extending from the source contact region at the first side of the die along the first edge surface to the second side of the die; and
    a second conductive path on the semiconductor die extending from the gate contact region at the first side of the die along the second edge surface to the second side of the die;
    wherein the semiconductor die is mounted to the circuit substrate so that the second side is proximate to the circuit substrate and the first side is distal to circuit substrate, wherein the first conductive path is coupled to a conductive region in the one or more conductive regions and the second conductive path is coupled to a conductive region in the one or more conductive regions.

19. The semiconductor die package of claim 18, wherein the semiconductor die includes an array of drain contact structures.

20. The semiconductor die package of claim 19, wherein the drain contact structures are in the form of mesas.

21. The semiconductor die package of claim 18, wherein the semiconductor die includes an one or more source contact structures.

22. The semiconductor die package of claim 21, wherein the one or more source contact structures are in the form of mesas.

23. The semiconductor die package of claim 18, wherein the semiconductor die includes an one or more gate contact structures.

24. The semiconductor die package of claim 23, wherein the one or more gate contact structures are in the form of mesas.

25. The semiconductor die package of claim 18, wherein the semiconductor die comprises a MOSFET.

* * * * *